United States Patent [19]

Fujibayashi

[11] 4,446,441

[45] May 1, 1984

[54] TRANSIENT NOISE FREE TYPE AMPLIFIER CIRCUIT

[75] Inventor: Kenji Fujibayashi, Tokyo, Japan

[73] Assignee: Olympus Optical Co., Ltd., Tokyo, Japan

[21] Appl. No.: 295,698

[22] Filed: Aug. 24, 1981

[30] Foreign Application Priority Data

Sep. 22, 1980 [JP] Japan .................. 55-135035

[51] Int. Cl.³ .................. H03F 1/26; H03F 3/30
[52] U.S. Cl. .................. 330/149; 330/273; 330/124 R
[58] Field of Search .................. 330/51, 123, 124 R, 330/149, 273

[56] References Cited

U.S. PATENT DOCUMENTS 4,331,930  5/1982  Shibata et al. .................. 330/273

FOREIGN PATENT DOCUMENTS 55-45227  3/1980  Japan .

Primary Examiner—James B. Mullins
Assistant Examiner—Gene Wan
Attorney, Agent, or Firm—Frishauf, Holtz, Goodman & Woodward

[57] ABSTRACT

A transient noise free type amplifier circuit includes a first amplifier having a noninverting input to which an input signal is applied, and a first output. An inverter inverts the input signal and supplies the inverted signal to a second amplifier having a signal input to which the inverted signal is applied, and a second output, and which second amplifier provides the same amplification as the first amplifier. A bias circuit supplies a predetermined bias potential to bias inputs of the first and second amplifiers, and a resistor circuit supplies the bias potential to the signal input of each of the inverter and the first amplifier. An output siganl which corresponds to the potential difference between the first output of the first amplifier and the second output of the second amplifier, is thus provided.

9 Claims, 6 Drawing Figures

TRANSIENT NOISE FREE TYPE AMPLIFIER CIRCUIT

BACKGROUND OF THE INVENTION

The present invention relates to an amplifier circuit capable of preventing the occurrence of transient noise such as pop noise caused at the time when a power source switch or muting switch is turned on and off.

Direct-current blocking capacitors are usually employed at various locations in amplifiers for tape recorders and the like. These capacitors form various time constant circuits in combination with resistors and the like which form the amplifier. Such time constants are usually different from one another. Therefore, unpleasant noise is caused at the transient time period during which the power source is turned on and the amplifier circuit attains to its normal operation point. This noise is known as so-called pop noise. Noise of this type can be practically eliminated by a specially-designed DC amplifier using positive and negative dual power sources, or a muting relay. However, in the case of a portable tape recorder driven by a battery, AC amplifiers of the single power source type are common. AC amplifiers of this type cause pop noise every time the power source is turned on and off. Noise of this type is also caused when muting operation is intended, by changing the bias potential which determines the operation point of amplifier.

SUMMARY OF THE INVENTION

The present invention is intended to eliminate the above-mentioned drawback, and the object of the present invention is therefore to provide an amplifier circuit capable of suppressing transient noise caused at a time when the power source is turned on and off.

To achieve the object of the present invention, an amplifier circuit according to the present invention employs a pair of amplifiers which operate reversely in phase to each other, and the supply of bias relative to these amplifiers is carried out substantially at same timing. Namely, even if transient noise is caused in each of the outputs of amplifiers, the same (or balanced) potential change appears at both output ends of the amplifiers. Therefore, if output signals are picked up through both output ends, no noise appears between these outputs whether transient noise is present or not. If this property is used, a muting operation without transient noise can also be achieved by changing over the bias potential, which is applied to the pair of amplifiers, between half of power source potential and zero potential. In addition, when the pair of amplifiers are used as power amplifiers, large power output can be obtained with low power source voltage. This is because the pair of amplifiers form a BTL (Balanced Transformer Less) circuit allowing output voltage of two times (or output power of four times) to be obtained as compared with the case where a single output amplifier is used. In addition, since no potential difference is caused between both output ends of paired amplifiers, output capacitors which are needed of large capacity can be omitted.

DETAILED DESCRIPTION OF THE PREFERRED EMBODIMENTS

Before proceeding with the description of embodiments of the present invention, it will expressly be understood that like reference symbols are used to designate like portions throughout the drawings for simplicity of illustration, and that components designated by like reference symbols may easily be replaced with each other or one another with minor change thereof by a skilled person in the art. An embodiment of a transient noise free type amplifier circuit according to the present invention will be now described.

Figure 1:
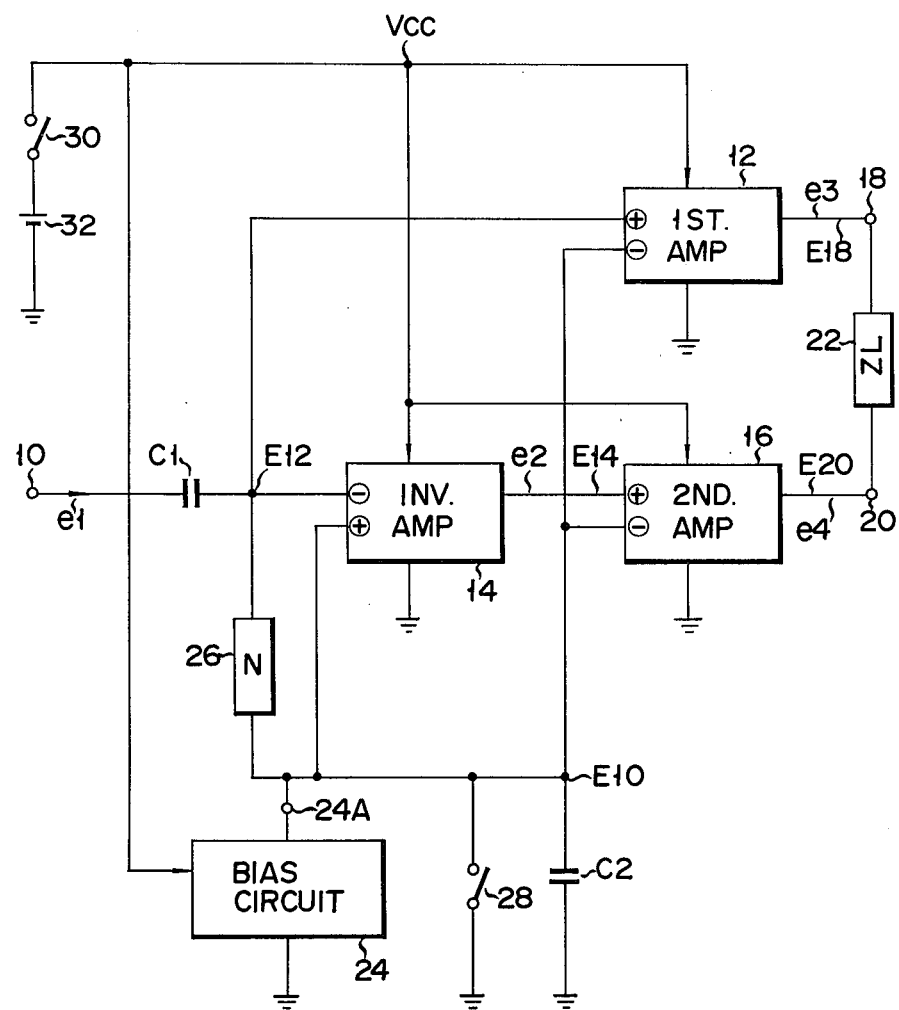
FIG. 1 is a block diagram showing an example of an amplifier circuit according to the present invention.

In FIG. 1, an input signal e1 applied to an input terminal 10 is then applied to the non-inverted input (signal input) of a first amplifier 12 through an input capacitor C1. The signal e1 passed through the capacitor C1 is also applied to the inverted input (signal input) of an inverted amplifier 14. The inverted amplifier 14 employed has an amplification factor of 1 and outputs a phase-inverted signal e2 which is opposite in phase to the signal e1. The signal e2 is applied to the non-inverted input (signal input) of a second amplifier 16. A load 22 is connected between outputs 18 and 20 of amplifiers 12 and 16.

To inverted inputs of amplifiers 12 and 16 and the non-inverted input of amplifier 14 is applied a bias potential E10 from the bias terminal 24A of a bias circuit 24. The potential E10 is set to be about half of a power source potential Vcc which is applied to amplifiers 12, 14 and 16. The potential E10 is applied to signal inputs of amplifiers 12 and 14 through an impedance element 26 having direct-current resistance. The current supply line of bias potential E10 is coupled through the parallel circuit of a by-pass capacitor C2 and a muting switch 28 to a circuit ground. The power source circuit of amplifiers 12, 14, 16 and bias circuit 24 is connected to a power source 32 through a power source switch 30. When the switch 30 is turned on, current having the power source potential Vcc is supplied to amplifiers 12, 14, 16 and circuit 24.

Let us consider the case where switches 28 and 30 are turned off. When the switch 30 is now turned on, the bias potential E10 rises progressively from zero to ½ Vcc. If the input bias current of amplifiers 12 and 14 is small enough and the direct-current resistance of element 26 is not too large, a potential E12 applied to signal inputs of amplifiers 12 and 14 is almost the same as the potential E10. Therefore, non-inverted and inverted input potentials E12 and E10 of amplifier 12 rise at the same rate. Since the potential E10 is supplied to the non-inverted input of amplifier 14 having an amplification factor of 1, the output potential E14 of amplifier 14 rises at same rate as the potential E10. Therefore, if amplifiers 12 and 14 have same circuit components, the output potential E18 of amplifier 12 and the output potential E20 of amplifier 16 carry out substantially the same potential change. The potential difference (E18−E20) between terminals 18 and 20 is therefore made zero, so that no signal current corresponding to pop noise (transient noise) just after the switch 30 is turned on flows to the load 22. The same thing can be said in the case where the switch 30 is turned off. Namely, potentials E12 and E14 fall at the same rate as the potential E10 and the potential difference between terminals 18 and 20 is kept at zero. Therefore, no pop noise is applied to the load 22 just after the switch 30 is turned off.

As described above, the circuit arrangement shown in FIG. 1 prevents pop noise from occuring by the turning on and off of switch 30. Similarly, the occurrence of pop noise following the turning on and off of muting switch 28 can also be prevented. When the switch 30 is turned on and the operation of the circuit becomes stable, potentials E12, E14, E18 and E20 become the same as the potential E10. When the switch 28 is turned on, the potential E10 becomes zero in a short time period. Potentials E12 and E14 fall this time at the same ratio as the potential E10, and potentials E18 and E20 carry out the same potential change. Therefore, the potential difference between terminals 18 and 20 is kept at zero, thus causing no pop noise. When the switch 28 is turned on, all of amplifiers 12, 14 and 16 are cut off and left under in a muting condition. Amplifiers 12, 14 and 16 consume little power under this muting condition. Therefore, when the power source 32 is a battery, the battery is not wasted. When the switch 28 is turned off, the bias potential E10 rises progressively. The behavior in this case may be considered the same as the case where the switch 30 is turned on. Namely, potentials E18 and E20 change at the same rate, thus causing no pop noise.

The muting circuit shown in FIG. 1 is superior to conventional ones, which serve only to turn on and off the voice signal line, in that the battery 32 is wasted less during the muting operation. In addition, no pop noise is caused following the muting operation.

When the power source switch 30 is turned on and the muting switch 28 off, a first output signal e3 which has same phase as that of input signal e1 is obtained from the amplifier 12 and a second output signal which has a phase reverse so that of input signal e1 is obtained from the amplifier 16. The difference of signals e3 and e4 is applied to the load 22 as an output signal corresponding to the input signal e1.

Figure 2:
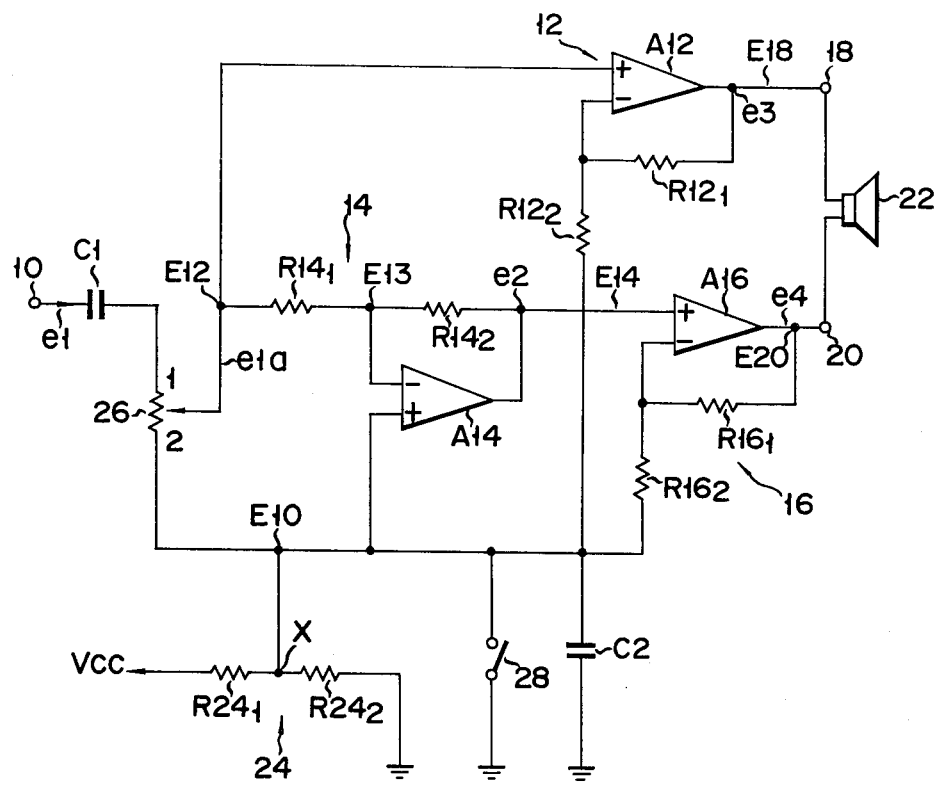
FIG. 2 is a circuit diagram showing the main portion of FIG. 1 in detail.

FIG. 2 shows an example of circuitry shown in block in FIG. 1.

An input signal e1 is applied to the first terminal of a variable resistor 26 via a capacitor C1. The second terminal of variable resistor 26 is connected to the connection point X between resistors $R24_1$ and $R24_2$. A bias potential E10 is obtained from the connection point X. To the other end of resistor $R24_1$ is applied a power source potential Vcc while the other end of resistor $R24_2$ is grounded. A signal $e1_a$ which is similar to the signal e1 is applied from the slider of variable resistor 26 to the non-inverted input of an amplifier A12. The output of amplifier A12 is coupled to a first output terminal 18 and to its inverted input via a resistor $R12_1$. The inverted input of amplifier A12 is connected to the connection point X via a resistor $R12_2$. The signal $e1_a$ is applied via a resistor $R14_1$ to the inverted input of an amplifier A14. The output of amplifier A14 is connected to its inverted input via a resistor $R14_2$. The non-inverted input of amplifier A14 is connected to the connection point X. An inverted signal e2 is supplied from the amplifier A14 to the non-inverted input of an amplifier A16. The output of amplifier A16 is connected to a second output 20 and to its inverted input via a resistor $R16_1$. The inverted input of amplifier A16 is connected to the connection point X via a resistor $R16_2$. A speaker 22 is connected as a load between output terminals 18 and 20. The current supply circuit relative to amplifier A12, A14 and A16 is omitted in FIG. 2.

It is assumed in FIG. 2 that amplifiers A12, A14 and A16 have sufficiently high open loop gain and input impedance and sufficiently small input offset current. It is also assumed that $R14_1=R14_2$ and $R12_1/R12_2=R16_1/R16_2$, and that the impedance of capacitor C2 is sufficiently small in the frequency band of input signal e1. Then, the amplifier A12 forms a positive phase amplifier whose amplification factor is $(1+R12_1/R12_2)$, and amplifiers A14 and A16 jointly form a negative phase amplifier whose amplification factor is $-(1+R16_1/R16_2)$. Therefore, the amplifier circuit shown in FIG. 2 forms a power amplifier of BTL type relative to the signal e1. However, amplifiers A12 and A14+A16 carry out in-phase operation relating to that potential change following the turning on and off of the power source or muting switch 28. Namely, the change of potential E10 following the turning on and off of the power source or muting switch 28 is same as those of amplifiers A12 and A16. Changes of potentials E12 and E14 are caused similarly following the change of potential E10. Namely, when the input offset current of amplifiers A12 and A14 is neglected, E10=E12.

The inverted input potential E13 of amplifier A14 becomes equal to E10 due to negative feedback action. This can be considered similarly to the fact that the inverted input of amplifier A14 becomes an imaginary ground when the potential appearing at the non-inverted input of amplifier A14 is considered as a reference (ground level). As described above, no current flows to resistors $R14_1$ and $R14_2$ since E10=E12=E13. Therefore, E13=E14, that is, E10=E12=E14. It results from this that potentials E12 and E14 change similarly following the change of potential E10, and that output potentials E18 and E20 also change at the same rate. Namely, the potential difference between both ends of speaker 22 is always at zero independently of change of potential E10, and no pop noise is caused following the turning on and off of the power source switch or muting switch 28.

The capacitor C2 serves to make substantially zero the AC impedance of current supply line of the bias potential E10 and to smoothly achieve the muting operation. Namely, the electric charge of capacitor C2 is discharged in a short time period by the turning on of switch 28 to stop the amplifying function at once. When the switch 28 is then turned off, the capacitor C2 is slowly charged via a resistor $R24_1$. Therefore, no large sound is suddenly generated through the speaker 22 at the instant when the switch 28 is turned off (or muted off).

Figure 3:
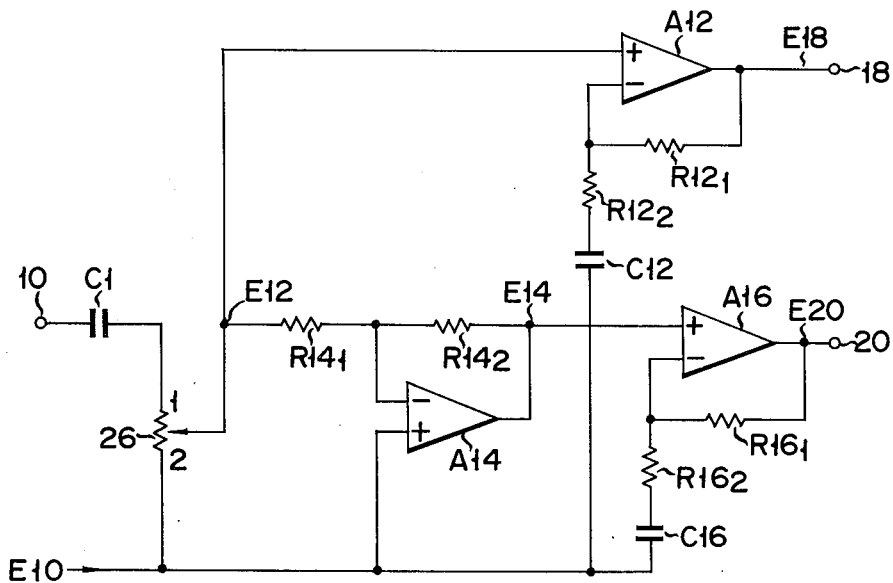
FIG. 3 is a circuit diagram showing a variation of FIG. 2.

FIG. 3 shows a modification of the circuit shown in FIG. 2. Capacitors C12 and C16 are arranged in series with resistors $R12_2$ and $R16_2$ which form a negative feedback loop. Capacitors C12 and C16 cause amplifiers A12 and A16 to achieve 100 percent negative feedback in the DC region. Therefore, DC drift at outputs 18 and 20 is smaller than that in FIG. 2. When time constants $C12 \cdot R12_2$ and $C16 \cdot R16_2$ are appropriately selected a, high-pass filter characteristic of cutting low band components unnecessary to reproduce voice sounds can be obtained. When it is arranged that $R12_1=R16_1$, $R12_2=R16_2$ and C12=C16, potentials E18 and E20 change similarly following the change of potential E10. Accordingly, even if capacitors C12 and C16 are added, no pop noise is caused.

Figures 4, 5, 6:
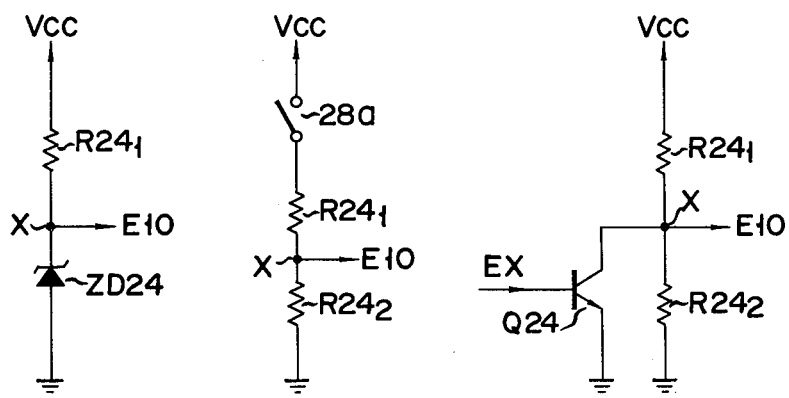
FIGS. 4 through 6 are circuit diagrams showing concrete examples of a bias circuit shown in FIG. 1.

FIGS. 4 through 6 show specifice examples of the circuit shown in FIG. 1. A resistance voltage divider is employed as the circuit 24 in FIG. 2, but a Zener diode ZD24 is employed in FIG. 4 to form a voltage-stabilized bias circuit. The muting switch 28 is arranged parallel to the resistor R24$_2$ in FIG. 2, but a muting switch 28a is arranged in series with a resistor R24$_1$ in FIG. 5. Switches 28 and 28a operate reversely but function similarly. Namely, a muting condition is established by the turning on of switch 28 in FIG. 2, but muting is established by the turning off of switch 28a in FIG. 5. FIG. 6 shows a case where the switch 28 in FIG. 2 is replaced by an electronic switch or NPN type transistor Q24. The connection point X between resistors R24$_1$ and R24$_2$ is grounded through the collector-emitter path of transistor Q24. The transistor Q24 is turned on and enters a muting condition when a muting designation signal EX is logic "1". When the signal EX is logic "0", a muting condition is released. The resistor R24$_1$ shown in FIGS. 2 through 6 may be replaced by an element having a constant current characteristic which appears, for instance, between the drain and source of a junction FET.

It should be understood that the present invention is not limited to embodiments described throughout the specification and shown in the drawings, and that various modifications and variations can be made within the scope of claims. If potentials E18 and E20 change similarly following the change of potential E10 in FIG. 1, for example, the circuit arrangement of first amplifier 12 may be different from that of second amplifier 16. Inverted amplifier 14 and second amplifier 16 may be regarded as an inverted amplifier (14+16). As long as a circuit having a inverted amplifying function is included in this amplifier (14+16), it does not depart from the scope of claims of the present invention. The amplifier circuit according to the present invention can be applied to a circuit of the positive and negative two power source type. The input capacitor C1 can be omitted in such case.

What is claimed is:
1. A transient noise free amplifier circuit, comprising:
   (a) first amplifier means having a noninverted input and a bias input, for receiving an input signal at the noninverted input and for supplying a first output signal corresponding to said input signal;
   (b) inverter means having an inverted input and a bias input, for receiving said input signal at the inverted input and for phase-inverting said input signal to generate an inverted signal;
   (c) second amplifier means having a noninverted input and a bias input, for receiving said inverted signal at the noninverted input and for supplying a second output signal corresponding to said inverted signal, said second output signal having an antiphase relation to said first output signal wherein said first and said second amplifier means perform a balanced transformerless amplifier operation;
   (d) bias means having a bias terminal for generating a first bias potential at said bias terminal and for applying said first bias potential to the bias input of each of said first amplifier means, said second amplifier means, and said inverter means, wherein said first bias potential determines an operational bias of said first amplifier means, said second amplifier means and said inverter means;
   (e) bias transfer means for transferring said first bias potential from the bias terminal of said bias means to the noninverted input of said first amplifier means and to the inverted input of said inverter means, so that said first amplifier means and said inverter means each receive a second bias potential corresponding to said first bias potential; and
   (f) output means coupled to said first and said second amplifier means, for providing an output signal corresponding to a potential difference between said first and said second output signals.

2. An amplifier circuit according to claim 1, further comprising:
   (g) muting means coupled to the bias terminal of said bias means and to a circuit having a predetermined potential, for changing the potential at the bias terminal from said first bias potential to said predetermined potential when a muting mode is established, so that said first and said second amplifier means are rendered inoperative.

3. An amplifier circuit according to claim 2, wherein said bias means have a predetermined internal resistance at the bias terminal thereof, said muting means includes a switch connected between said bias terminal and said predetermined potential circuit, and a capacitor connected in parallel to said switch, so that said capacitor is charged through the predetermined internal resistance of said bias means when the switch is opened and is discharged through said switch when said switch is closed.

4. An amplifier circuit according to claim 2, further comprising power supply means for supplying a power source potential, wherein said bias means includes voltage dividing means connected to said power supply means, for generating the first bias potential from the power source potential, and said muting means includes a muting switch connected between said power supply means and said voltage dividing means, the first bias potential being generated only when the muting switch is closed.

5. An amplifier circuit according to claim 3, wherein said first amplifier means, said inverter means, said second amplifier means and said bias means are arranged to be supplied with power from a single source at a certain voltage potential, and the potential of said predetermined potential circuit is substantially zero.

6. An amplifier circuit according to any one of claims 1 to 3, wherein said inverter means includes an inverting amplifier whose amplification factor is substantially one, and said first and said second amplifier means include amplifiers which are substantially identical.

7. An amplifier circuit according to any one of claims 1 to 3, wherein said bias transfer means includes a variable resistor circuit.

8. An amplifier circuit according to claim 7, wherein said variable resistor circuit is operative to change the signal level of said input signal.

9. An amplifier circuit according to any one of claims 1 to 3, or 8, wherein said first amplifier means includes a first amplifier having an output connected to said output means and an inverted input, and a first negative feedback circuit connected between the output and the inverted input of said first amplifier and between the inverted input thereof and the bias terminal of said bias means; and
   said second amplifier means includes a second amplifier having an output connected to said output means and an inverted input, and a second negative feedback circuit connected between the output and the inverted input of said second amplifier and between the inverted input thereof and the bias terminal of said bias means.

* * * * *

UNITED STATES PATENT AND TRADEMARK OFFICE
CERTIFICATE OF CORRECTION

PATENT NO. : 4,446,441
DATED : May 1, 1984
INVENTOR(S) : Kenji Fujibayashi

It is certified that error appears in the above-identified patent and that said Letters Patent is hereby corrected as shown below:

IN THE ABSTRACT:

Line 12, change "siganl" to --signal--;

Column 1, line 18, after "circuit attains", delete "to";

Column 3, line 57, after "resistor $R12_2$.", the words "The signal $el_\alpha$ is" should begin a new paragraph;

Column 4, line 44, after "impedance of", insert --the--;

Column 4, line 61, the words "selected a," should read --selected, a--;

Column 5, line 1, change "specifice" to --specific--;

Column 5, line 1, after "of the", insert --bias--;

Column 5, line 34, after "cluded in", delete "this";

Column 6, line 44, change "1 to 3" to -- 1 to 5--;

Column 6, line 48, change "1 to 3" to -- 1 to 5 --;

Column 6, line 54, change "1 to 3" to -- 1 to 5 --.

Signed and Sealed this

Nineteenth Day of March 1985

[SEAL]

Attest:

DONALD J. QUIGG

Attesting Officer     Acting Commissioner of Patents and Trademarks